US006489802B2

(12) United States Patent
Rivoir et al.

(10) Patent No.: US 6,489,802 B2
(45) Date of Patent: Dec. 3, 2002

(54) DIGITAL SIGNAL TRANSITION SPLITTING METHOD AND APPARATUS

(75) Inventors: Jochen Rivoir, Sunnyvale, CA (US); Ajay Khoche, Cupertino, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/832,726

(22) Filed: Apr. 10, 2001

(65) Prior Publication Data

US 2002/0145449 A1 Oct. 10, 2002

(51) Int. Cl.$^7$ ................................................ H03K 19/00

(52) U.S. Cl. ............................ 326/16; 326/93; 326/99

(58) Field of Search ............................ 326/93, 94, 99, 326/16; 327/115, 116, 117, 119

(56) References Cited

U.S. PATENT DOCUMENTS 5,945,857 A * 8/1999 Havens ....................... 327/175

* cited by examiner

*Primary Examiner*—Michael Tokar
*Assistant Examiner*—Anh Q. Tran

(57) ABSTRACT

A transition splitting apparatus and method reduce a maximum transition rate of a digital signal. The apparatus and method are particularly useful for digital signal processing in communications and for performing digital transition timing testing on a device under test. The apparatus and method split a digital signal into two or more signals, while preserving the relative timing of transitions in the digital signal. A high frequency signal is partitioned by the apparatus and method into a plurality of equivalent lower frequency signals without loss of transition timing information. The apparatus is implemented with readily available components. The maximum transition rate of a digital signal is reduced by a factor of two or more, and is proportional to the number of output signals. A plurality of the apparatuses may be cascaded together into a system to achieve even greater reductions in maximum transition rates.

18 Claims, 6 Drawing Sheets

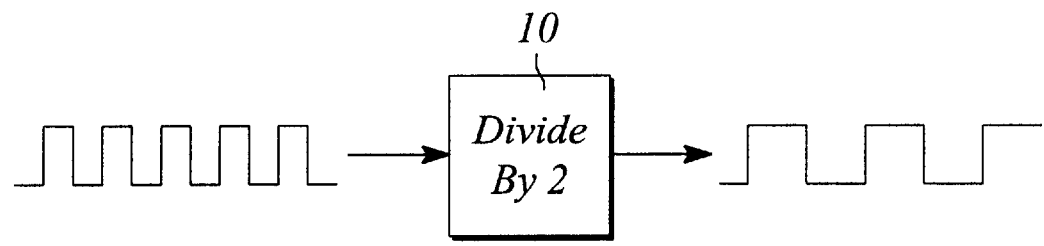
*FIG. 1A*  *Prior Art*
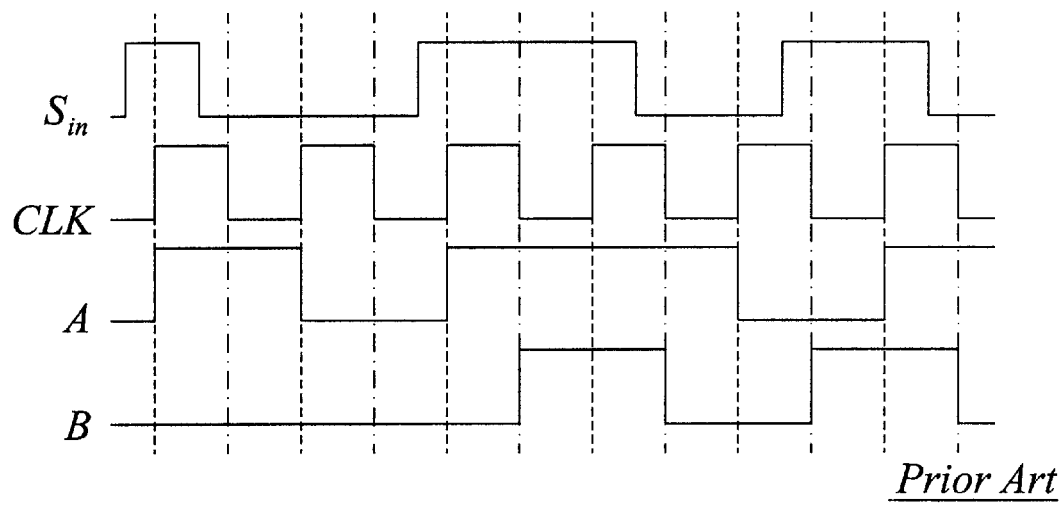
*FIG. 1B*  *Prior Art*
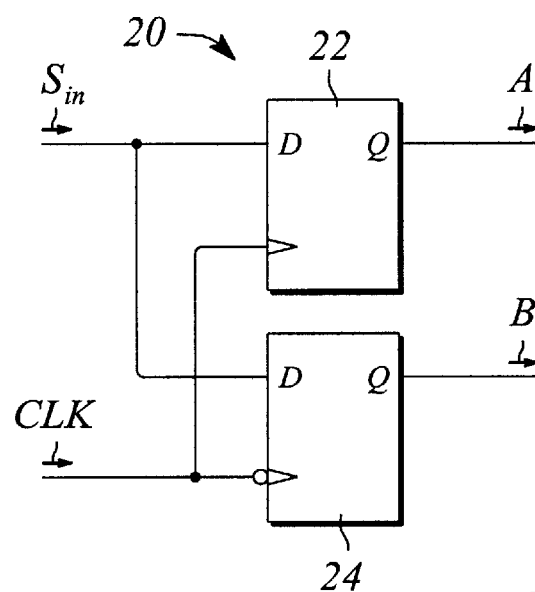
*FIG. 1C*  *Prior Art*

DIGITAL SIGNAL TRANSITION SPLITTING METHOD AND APPARATUS

TECHNICAL FIELD

The invention relates to signal processing and device testing involving high-speed digital signals. In particular, the invention relates to reducing input transition rates when performing signal processing with digital devices and during testing of high-speed digital devices.

BACKGROUND ART

Clock rates in digital systems and the semiconductor devices or integrated circuits (ICs) that invariably make up the systems continue to increase. Associated with the increases in clock rates is an increase in data rates of signals generated by the digital systems. The data rate of a digital signal is proportional to the rate of logic transitions found in the signal and is sometimes referred to as the transition rate. Increases in transition rates of signals produced by modem digital systems are expected to continue for the foreseeable future.

Rapid or high transition rates typical of the signals generated by modem digital systems pose a problem for components and systems that must receive and process these signals. As transition rates increase, the cost and complexity of these so-called 'downstream' components and systems tend to increase dramatically. In an analogous manner, fast transition rates of the signals generated by modem digital systems also significantly increase the difficulty of adequately and accurately testing these systems. At the very least, the fast transition rate of the high speed signals tend to significantly increase the cost of the test equipment required for adequate testing. In addition, relatively expensive test equipment is often rendered obsolete by increases in transition rates over time. Obsolescence of modem test equipment associated with transition rate increases can occur in a very short time given the current frenetic pace of clock and transition rate increases.

To avoid the use of high speed, expensive downstream components and to avoid the need for upgrading or replacing test equipment to accommodate increases in transition rates, it is sometimes attractive to employ approaches to signal processing and/or testing that attempt to reduce the maximum transition rates of the signals of interest. In essence, the maximum transition rate experienced by downstream components and/or test equipment can be reduced in some cases by inserting a transition rate-reducing device between the component or piece of test equipment and the digital system generating the signal. If the transition rate can be reduced while simultaneously maintaining the integrity of the data contained in the signal, lower cost components can be used to process the signal and/or test the device that generated the signal. The discussion that follows, while focusing on test equipment for simplicity, applies equally well to any downstream component that must receive and process high-speed signals.

One approach to reducing transition rates is known as frequency division. This approach is most effective for signals, such as clock signals that are relatively narrowband. A device known as a frequency divider reduces the frequency or transition rate of a signal. Typically, frequency dividers for digital signals are implemented using one or more flip-flops and provide integer division of the input frequency. However, this approach is not particularly useful for signals that contain data since these signals are typically not narrowband. Moreover, frequency division of signals that contain data typically results in the loss of some of the data of the signal. Loss of data is normally unacceptable. Thus, this technique is most often used for reducing the transition rate of signals, such as clock signals, that contain little or no data. The concept of frequency division of a clock signal is illustrated in FIG. 1A. In FIG. 1A, a frequency divider 10 with a division factor of two is illustrated operating on a clock signal.

Another approach to transition rate reduction, sometimes referred to as 'sampling', employs a waveform sampler between the device under test (DUT) and the test equipment. The signal is sampled by the waveform sampler to produce two or more sub-signals, each containing a portion of the data contained in the original, higher speed signal. The two or more sub-signals each have a lower transition rate than the original signal. Several parallel channels within the test equipment then process the sub-signals. For example, in one implementation, odd numbered samples of the waveform are contained in a first sub-signal and are processed by a first channel, while even numbered samples are contained in a second sub-signal and are processed by a second channel. Typically the channels of the test equipment operate in parallel to simultaneously process the sub-signals.

The sampling concept is illustrated in FIG. 1B and FIG. 1C. As illustrated in FIG. 1B, a signal under test $S_{in}$ is sampled by a sampler. The sampler is clocked by a clock signal CLK and samples are taken at both the rising and falling edges of the clock signal. The sampler produces two sub-signals A and B as illustrated in FIG. 1B. Sub-signal A represents the amplitudes of samples of the signal under test $S_{in}$ at odd numbered sample intervals corresponding in this case to rising edges of the sampling clock signal CLK. Sub-signal B represents samples at even numbered sample intervals taken at falling edges of the clock signal CLK. Two parallel channels are used in the test equipment (not illustrated) to simultaneously process the sub-signals A and B. Once processed, bit level information of the original signal under test can be extracted. The effective transition rate reduction for the example illustrated is a factor of two. Further reductions in the maximum transition rate can be ,realized with the addition of more parallel channels, more delayed versions of the clock signal CLK, and more sub-signals.

FIG. 1C illustrates one implementation of a sampler 20. As illustrated, the sampler comprises a first D flip-flop 22 and a second D flip-flop 24. The signal under test $S_{in}$ is applied to data inputs of the first and second D flip-flops 22, 24. The sampling clock signal CLK is applied to a clock input of the first D flip-flop. An inverse of the clock signal CLK is applied to a clock input of the second D flip-flop 24. Each rising edge of the clock signal CLK causes the first D flip-flop 22 to sample the signal $S_{in}$ while each falling edge of the clock signal causes the second D flip-flop 24 to sample the signal $S_{in}$. The sub-signals A and B are output at outputs Q of the first and second D flip-flops 22, 24 respectively.

The samples in the sampling approach described hereinabove are generally treated and can be viewed as two or more interleaved signals from a processing standpoint. Typically in this approach, the sampler measures signal amplitude at each sample point. Therefore, information regarding digital signal transition timing is generally unavailable except at a coarse level. In addition, careful synchronization of the sampler and the signal under test is often required to insure the validity and usefulness of the samples in the sub-signals.

Accordingly, it would be advantageous to have an apparatus and method for use in testing and/or processing of digital signals that significantly improved the frequency scalability of test equipment or downstream communications signal processing components, for example, by reducing the maximum transition rate of the signals. In addition, it would be desirable that such an apparatus and method, while reducing the maximum transition rate of the signal, preserved transition timing information of the signal, thereby enabling precision timing tests to be performed on the DUT or enabling downstream precision signal processing. Moreover, it would be desirable that such an apparatus and method could be realized without requiring tight synchronization to the signal under test or the use of a synchronized clock signal and that such an apparatus and method could be implemented using standard, readily available components. Such an apparatus and method would solve long-standing needs in the area of communications and high transition rate digital IC and system testing.

SUMMARY OF THE INVENTION

The present invention provides a novel transition splitter apparatus and method for reducing a maximum transition rate of digital signals. The novel apparatus of the present invention is particularly useful in digital signal processing and for performing digital transition timing testing on a device under test. The apparatus splits a digital signal into two or more signals while preserving the timing of transitions in the signal. The transition splitting apparatus of the present invention is implemented with readily available components and reduces the maximum transition rate of a digital signal by at least a factor of two. With the transition splitting apparatus of the present invention, a high frequency signal is partitioned into two equivalent lower frequency signals without loss of any information, including transition timing information. The transition splitting apparatus can be cascaded to achieve greater reductions in maximum transition rates.

In one aspect of the present invention, a transition splitter apparatus for reducing a transition rate of a digital signal while preserving relative transition timing of the digital signal is provided. The apparatus of the present invention comprises an input port that receives the digital signal, a plurality of K output ports, where K is an even number greater than or equal to 2, and a splitter connected between the input port and the K output ports. The splitter produces a different output signal at each output port having transitions corresponding to occurrences of a particular transition type in the digital signal. Thus, each output signal has a fraction of the data or transition rate of the digital signal, and as such, each output signal has a fraction of the number of transitions and a fraction of the transition timing in the digital signal. Assuming that no transition types existing in the digital signal are ignored, the fractional transition rate is proportional to the number K of the output signals provided by the splitter.

In one embodiment of the transition splitter apparatus, K is equal to 2 and the splitter comprises two data or D latches and an inverter connected to the enable input one of the latches. Each data latch produces a different output signal that has a reduced transition rate relative to the transition rate of the digital signal. The digital input signal is received at a first latch enable input of a first of the latches and the inverter connected to the enable input of a second of the latches. The input signal comprises different transition types, such as a transition from a low logic state to a high logic state and a transition from a high logic state to a low logic state. Another transition type may be the timing or occurrence of a particular transition. The output signals from the data latches each have a different set of transitions corresponding to occurrences and/or types of transitions in the input signal. One transition type will enable the first data latch and disable the second data latch, such that the enabled first latch will produce a transition in its respective output signal. Another second transition type will enable the second data latch and disable the first data latch, such that a transition is produced in the output signal of the enabled second latch. The sum of the reduced transition rates (or number of transitions per unit time) of the first output signal and of the second output signal equals the transition rate of the original digital input signal being processed, or tested from the a device under test, depending on the application.

In other embodiments of the transition splitter apparatus, K is equal to 2 and the splitter comprises either two data flip-flops or two toggle flip-flops. Similar to the data latch embodiment, one transition type in the digital input signal will clock a first of the flip-flops, but not the other, such that the output signal from the clocked flip-flop will have a transition corresponding to the occurrence of this transition type. Another transition type in the input signal will clock a second of the flip-flops, but not the first, such that the output signal from the clocked second flip-flop will have a transition corresponding to the occurrence of this other transition type.

In another aspect of the present invention, a transition splitter apparatus that produces K output signals is provided, where K is preferably greater than 2. According to this embodiment, the transition splitter comprises an input port that receives a digital signal, K output ports, and K splitters connected together as a cascade. Each of the K output signals comprises a fraction of the number of transitions that is proportional to K, while preserving relative timing of the transitions in the digital signal. In one embodiment, the splitters are transparent data latches each having a data input, an enable input and an output. The input port is connected to each of the latch enable inputs, such that the enable input of every other latch is invertedly connected to the input port. The output of each latch is connected to a different one of the K output ports. In addition, each output of a first latch to a K–1 latch is further connected to the data input of a respective subsequently adjacent latch in the cascade while the output of the K-th latch is further invertedly connected to the data input of the first latch.

In yet another aspect of the present invention, a first method and a second method of transition splitting a digital signal are provided. Each method splits the digital input signal into a plurality of output signals that can be further processed, either by test equipment or communications digital signal processing equipment, for example. The input signal has a number of transitions per second. Each output signal has a fraction of the number of transitions per second of the input signal. The first method comprises the steps of detecting a transition in the input signal and determining the type of the detected transition. One of a plurality of output signals is chosen to correspond with the transition type and an output transition is created in the chosen output signal. The steps of detecting, determining, choosing and creating are repeated for each transition in the input signal, such that the relative timing of each of the transitions in the input signal is preserved.

The second method according to the invention comprises the steps of selecting an output signal from the plurality of output signals, detecting a transition in the input signal and creating an output transition in the selected output signal corresponding to the detected input signal transition. The above steps are repeated for a number of transitions in the digital input signal, such that relative timing of the transitions in the digital signal is preserved. The number of transitions detected can be all transitions or less than all transitions in the digital input signal. When less than all transitions in the input signal are detected, the method steps may be repeated to detect those transitions that were not originally detected.

In still another embodiment of the present invention, a system or cascade of transition splitter apparatuses is provided. The system splits a digital input signal into a plurality of output signals, each output signal having a fraction of a transition rate of the input signal. The system comprises a first tier transition splitter having a first input that receives the input signal and two first outputs. The first tier transition splitter produces different first output signals. The first tier output signals each having one half of the transition rate of the input signal. The system further comprises a pair of second tier transition splitters. Each second transition splitter has a second input and two second outputs. Each one of the first tier output signals is received by a different one of the second tier inputs. Both of second tier transition splitters produce two different second tier output signals. The second tier output signals each have one fourth of the transition rate of the original input signal. The system of transition splitters has $2^M$ outputs, where M is the number of tiers. Each output signal from a system output has fraction of the transition rate of the original digital input signal that is proportional to $2^M$ and preserves the relative timing of the transitions in the original input signal.

In still another aspect of the invention, a method of reducing the transition rate of a digital signal is provided. The method comprises the steps of cascading a plurality of transition splitters together in a number of tiers and reducing the transition rate by a reduction factor equal to $2^M$ in the output signals, where M is the number of tiers, while preserving relative transition timing of the digital signal. Each tier comprises an increasing number of splitters per tier and the output signals from a splitter in one tier becomes the input signals to two different splitters in an adjacent greater tier.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which:

FIG. 1A illustrates a block diagram of a conventional approach to reducing the frequency of a clock signal using a frequency divider.

FIG. 1B illustrates a timing diagram of a signal having a reduced transition rate using a conventional sampling approach.

FIG. 1C illustrates a schematic diagram of a conventional apparatus for sampling the signal of FIG. 1B.

MODES FOR CARRYING OUT THE INVENTION

The present invention is a novel apparatus and method of reducing a maximum transition rate of a digital waveform signal. In particular, the apparatus and method of the present invention preserve timing information associated with state transitions in the digital waveform of the signal. The method and apparatus are applicable to testing of high speed digital devices, especially testing with test instrumentation. In addition, the method and apparatus are applicable to processing of high speed digital signals by downstream lower speed components. For simplicity only, the discussion that follows focuses on the method and apparatus of the present invention as they are applied to testing a device under test (DUT) with a piece of test equipment or with an automated test equipment (ATE). However, this discussion is equally applicable to digital signal processing by downstream components in communications applications. One skilled in the art would readily recognize the equivalence of a piece of test equipment and any other downstream component that receives a high-speed digital signal from a digital device.

The transition splitter apparatus of the present invention creates two output signals from a single input signal. A first output signal represents odd numbered transitions while a second output signal represents even numbered transitions. The time differences between transitions in the first output signal are equal to the time differences between odd numbered transitions in the input signal. The time differences between transitions in the second output signal are equal to the time differences between even numbered transitions in the input signal. Moreover, the relative timing between transitions in the first and second output signals reflects the relative timing between transitions in the input signal.

Figure 2A:
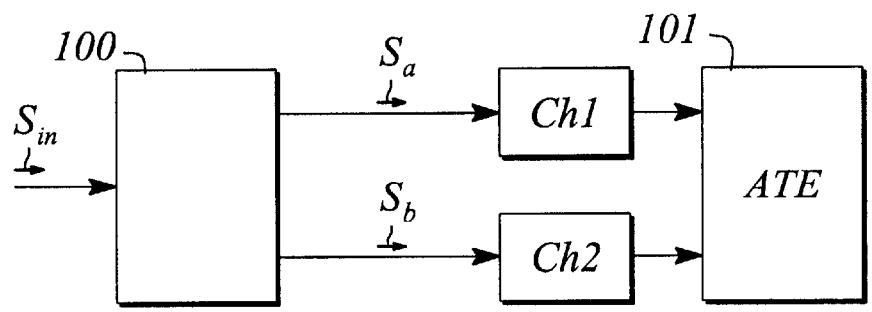
FIG. 2A illustrates a block diagram of a transition splitting apparatus of the present invention for splitting a digital signal.
Figure 2B:
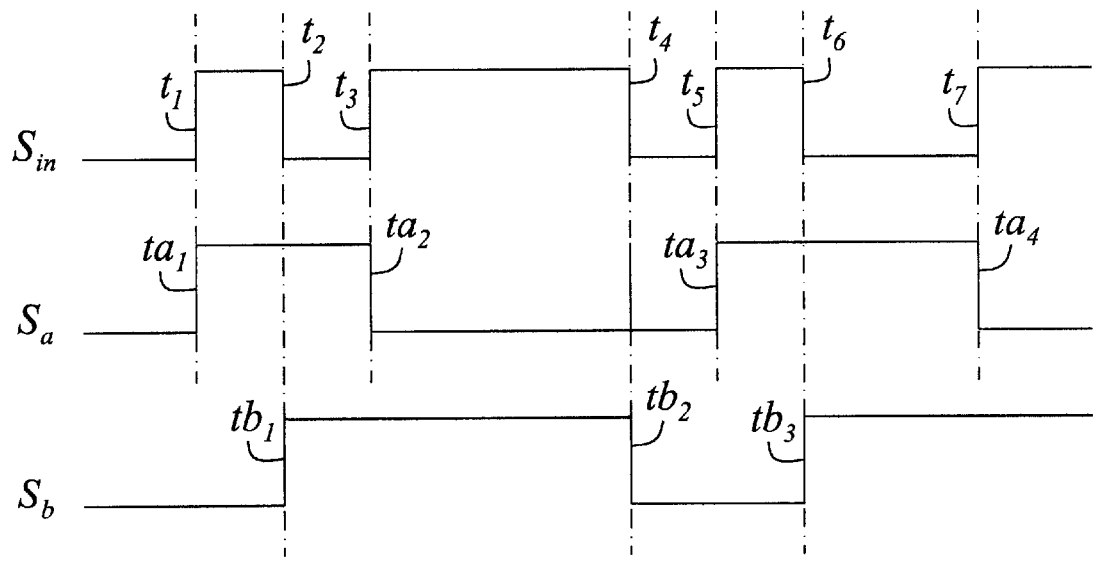
FIG. 2B illustrates a timing diagram of the relationship between transitions in an input signal and transitions in a pair of output signals generated by the transition splitting apparatus of FIG. 2A.

To better understand the operation of the transition splitter apparatus of the present invention, consider an example illustrated in FIGS. 2A and 2B. FIG. 2A illustrates a block diagram of a transition splitter apparatus 100 of the present invention along with a typical ATE 101. The transition splitter 100 comprises an input port, first and second output ports and a splitter connected between the input port and the first and second output ports. The apparatus 100 operates on an example input signal $S_{in}$ to produce a first output signal $S_a$ and a second output signal $S_b$. The output signals $S_a$ and $S_b$ have a lower maximum transition rate than the input signal $S_{in}$ by virtue of the action of the transition splitter 100. The ATE 101 receives and processes the pair of output signal $S_a$ and $S_b$. FIG. 2B illustrates the relationship between transitions in the input signal $S_{in}$ and the first and second output signals $S_a$ and $S_b$.

Referring to FIG. 2B, when the input signal $S_{in}$ is applied to an input of the transition splitter apparatus 100, the transition splitter begins searching for transitions, (i.e. changes in logic state) in the input signal $S_{in}$. Upon detecting a first transition $t_1$, the transition splitter 100 produces a first transition $ta_1$ in the first output signal $S_a$. For example, if the first output signal $S_a$ is assumed to start at a low state '0', as illustrated in FIG. 2B, then the transition splitter 100 will cause the first output signal $S_a$ to transition from the low state '0' to a high state '1' upon detecting a first transition $t_1$. Upon detecting a second transition $t_2$ in the signal $S_{in}$, the transition splitter 100 produces a first transition $tb_1$ in the second output signal $S_b$. A third transition $t_3$ in the signal $S_{in}$, results in a second transition $ta_2$ in the first output signal $S_a$ while a fourth transition $t_4$ results in a second transition $tb_2$ in the second output signal $S_b$. The process repeats for all transitions in the input signal $S_{in}$ such that transitions in the first output signal $S_a$ correspond to odd numbered transitions and transitions in the second output signal $S_b$ correspond to even numbered transitions in the input signal $S_{in}$.

The relative timing of the transitions in the first signal $S_a$ and the second signal $S_b$ produced by the transition splitter 100 correspond to the relative timing of the respective transitions in the input signal $S_{in}$. By correspond, it is meant that the time difference between a pair of transitions in the first signal $S_a$ or the second signal $S_b$ is equal to the time difference between the corresponding transitions in the input signal $S_{in}$. Moreover, the relative time difference between a pair of transitions, one in the first output signal $S_a$ and one in the second output signal $S_b$ is the same as the time difference between two corresponding transitions in the input signal $S_{in}$.

Referring back to the example illustrated in FIGS. 2A and 2B, the time difference between transitions $ta_1$ and $ta_2$ of the first output signal $S_a$ is equal to the time difference between the transitions $t_1$ and $t_3$ of the input signal $S_{in}$. Likewise, the time difference between transitions $tb_1$ and $tb_2$ of the second output signal $S_b$ is equal to the difference between the transitions $t_2$ and $t_4$ of the input signal $S_{in}$. Furthermore, the time between transitions $ta_2$ and $tb_2$ of the first output signal $S_a$ and the second output signal $S_b$, respectively, is equal to the time difference between the transitions $t_3$ and $t_4$ of the input signal $S_{in}$. Thus, the transition splitter 100 of the present invention preserves the timing information of all transitions in the input signal $S_{in}$ when creating the output signals $S_a$ and $S_b$.

The transition splitter 100 of the present invention also reduces the maximum transition rate of the output signals $S_a$ and $S_b$ by a factor of two relative to the transition rate of the input signal $S_{in}$. Every other transition in the input signal $S_{in}$ ends up producing a single transition in only one of the output signals.

As illustrated in FIG. 2A, the two output signals $S_a$ and $S_b$ having a lower transition rate can be independently processed in parallel by two parallel channels of an ATE. The two parallel channels $Ch_1$ and $Ch_2$ need only be capable of handling transition rates that are one half that of the input signal $S_{in}$. Subsequent processing within the ATE can be used to re-integrate the two sets of transition time data generated by the parallel channels $Ch_1$ and $Ch_2$, thereby facilitating extraction of all timing data associated with the original input signal $S_{in}$. In a communications application, the ATE 101 is replaced by components for digital signal processing. The downstream components are more readily able to process the output signals $S_a$ and $S_b$ having a lower transition rate of the present invention.

It should be noted that the discussion hereinabove referred to timing differences of transitions as being 'equal'. This assumes that ideal components are used to implement the transition splitter 100. One skilled in the art would recognize that the degree of equality depends on the timing characteristics of the devices used to implement the transition splitter 100. Very good approximations to equality, at least sufficient for test and measurement purposes, can be readily achieved in practice. However, the scope of the invention is not limited to equal timing differences of transitions.

Figure 3:
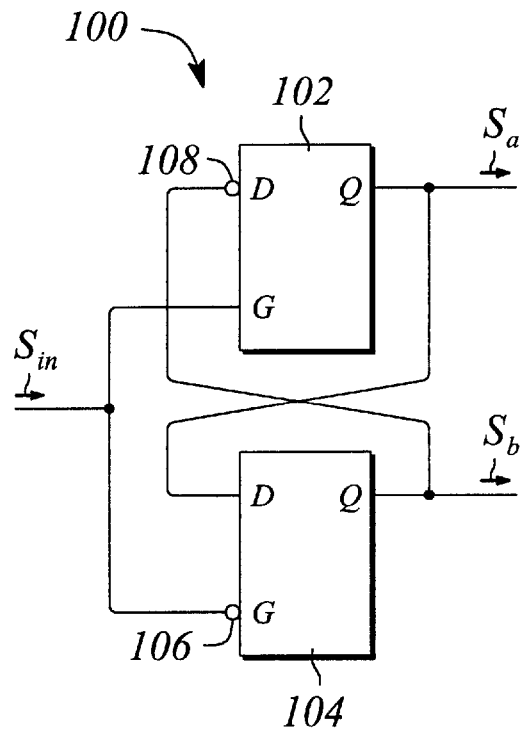
FIG. 3 illustrates one embodiment of a transition splitter apparatus according to the present invention employing type D latches.

FIG. 3 illustrates a block diagram one embodiment of the transition splitter apparatus 100 of the present invention. In this embodiment, the splitter comprises a first latch 102 and a second latch 104. Each latch 102, 104 has a data input D, an enable input G and an output Q. The splitter of the transition splitter 100 further comprises a first inverter 106 and a second inverter 108. An input signal $S_{in}$ is applied to the enable input G of the first latch 102 and to an input of the first inverter 106. The output of the first inverter 106 is connected to the enable input G of the second latch 104. The output of the first latch 102 is connected to the data input D of the second latch 104. The output Q of second latch 104 is connected to an input of the second inverter 108. The output of the second inverter 108 is connected to the data input D of the first latch 102. When the input signal $S_{in}$ is applied, the signal $S_a$ is produced at the output Q of the first latch 102 while the signal $S_b$ is produced at the output Q of the second latch 104.

The latches 102, 104 are known in the art as transparent data latches. When enabled, the output logic state of the latches 102, 104 is equal to the input logic state present at the data input D. When disabled, the output logic state of the latches 102, 104 is the logic state that was present at the data input during the last period in which the latches 102, 104 were enabled. For example, if a logic high 'H' is applied to the enable input G of a data latch 102, 104, the output Q of each latch 102, 104 will follow the logic state of the data input D. When a logic low 'L' is then applied to the enable input G of the latches 102, 104, the logic state of the output Q will remain stable, independent of the logic state applied to the data input D.

Assume that the input signal $S_{in}$ at the enable input G and the two output signals $S_a$ and $S_b$ at the outputs Q of the first and second latches 102, 104, respectively, are forced to a logic low state represented hereinbelow as '0', and further, assume that a '1' represents a logic high for the purposes of the following discussion.

A first transition from the logic state '0' to the logic state '1' in the input signal $S_{in}$ enables the first latch 102 and disables the second latch 104. The output of the second latch 104, initially a logic state '0', is transformed to a logic state '1' by the second inverter 108 and since the first latch 102 is enabled, the logic '1' propagates through the latch 102 to the output Q. The propagation of the logic '1' through the first latch 102 causes a transition from logic '0' to logic '1' to be produced in the output signal $S_a$. Since the second latch 104 is disabled, no transition occurs at this point in time in the output signal $S_b$.

A second transition in the input signal $S_{in}$ is from the logic '1' to a logic '0' and causes the first latch 102 to be disabled and the second latch 104 to be enabled. The disabling of the first latch 102 causes its output Q to remain at the logic '1'. Just prior to the logic '1'-to-logic '0' transition, the output Q of the second latch 104 is a logic '0'. Since the logic '1' is present at the data input D of the second latch 104 when it is enabled by the second transition in the input signal $S_{in}$, the logic '1' propagates through the second latch 104 and produces a logic '0'-to-logic '1' transition in the output signal $S_b$. The output signal $S_a$ does not change at this point since the first latch 102 is disabled.

A third transition in the input signal $S_{in}$ is from the logic '0' to a logic '1'. This transition enables the first latch 102 and disables the second latch 104. The second latch 104 holds the logic '1' at its output Q that, through the action of the second inverter 108, presents the logic '0' to the data input D of the first latch 102. The logic '1' propagates through the first latch 102 and causes a logic '1'-to a logic '0' transition in the signal $S_a$. A fourth transition similarly causes a logic '1'-to a logic '0' transition in the output signal $S_b$. Thus, the transition splitter 100 illustrated in FIG. 3 creates a transition in the output signal $S_a$ for all odd numbered transitions in the input signal $S_{in}$ and creates a transition in the output signal $S_b$ for all even numbered transitions in the input signal $S_{in}$.

One skilled in the art would readily recognize that there are several alternate but equivalent forms of the splitter of the transition splitter 100. For example, some latches provide both an output Q and an inverted output Q'. An equivalent form of the transition splitter 100 could be constructed with one or both of the latches having the two output types (output Q and inverted output Q') and omitting the second inverter 108. The inverted output Q' of second latch 104' is then connected to the data input D of the first latch 102, 102'. All such equivalent forms are within the scope of the present invention.

Figure 4:
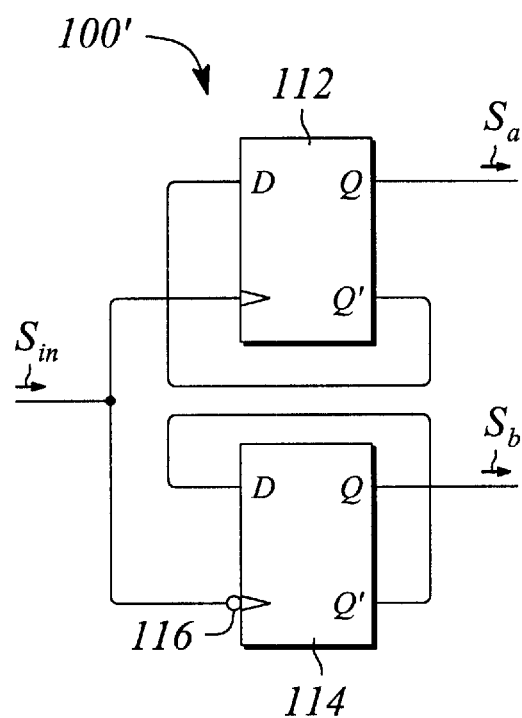
FIG. 4 illustrates another embodiment of a transition splitter apparatus according to the present invention employing type D flip-flops.

FIG. 4 illustrates another embodiment of the transition splitter 100' of the present invention. In this embodiment, the splitter comprises a first flip-flop 112 and a second flip-flop 114. The first flip-flop 112 and the second flip-flop 114 each have a data input D, a clock input, an output Q and an inverted output Q'. The inverted output Q' produces a logic state that is the inverse of the logic state at the output Q. The flip-flops are so-called 'data flip-flops' or 'D flip-flops'. As is standard practice, the clock input is indicated by the triangle in the block diagram illustrated in FIG. 4. The splitter of the transition splitter 100' further comprises an inverter 116. An input signal $S_{in}$ is applied to the clock input of first flip-flop 112 and to an input of the inverter 116. An output of the inverter 116 is connected to the clock input of the second flip-flop 114. The inverted output Q' of the first flip-flop 112 is connected to the data input D of the first flip-flop 112. The inverted output Q' of the second flip-flop 114 is connected to the data input D of the second flip-flop 114. The output signal $S_a$ is produced by the output Q of the first flip-flop 112 while the output signal $S_b$ is produced by the output Q of the second flip-flop 114.

To understand the operation of the transition splitter 100', assume that the input signal $S_{in}$ and the output signals $S_a$ and $S_b$ start at a low state '0', a first transition from the logic '0' to a logic '1' in the signal $S_{in}$ clocks the first flip-flop 112. When clocked, the first flip-flop 112 transfers the logic '1' produced by the inverted output Q' present at its data input D to its output Q resulting in a logic '0'-to-a logic '1' transition in the signal $S_a$. Simultaneously, the inverted output Q' of the first flip-flop 112 transitions from the logic '1' present prior to clocking to the logic '0'. A second transition in signal $S_{in}$ is from the logic '1' to a logic '0' that clocks the second flip-flop 114 by virtue of the presence of the inverter 116 on the clock input of the second flip-flop 114. When clocked, the second flip-flop 114 transfers the logic '1' at its data input D to its output Q resulting in a logic '0'-to-a logic '1' transition in the signal $S_b$. Simultaneously, the inverted output Q' of the second flip-flop 114 transitions from the logic '1' present prior to clocking to the logic '0'. A third transition in the input signal $S_{in}$ is from the logic '0' to the logic '1', which once again clocks the first flip-flop 112 and so on.

Figure 5:
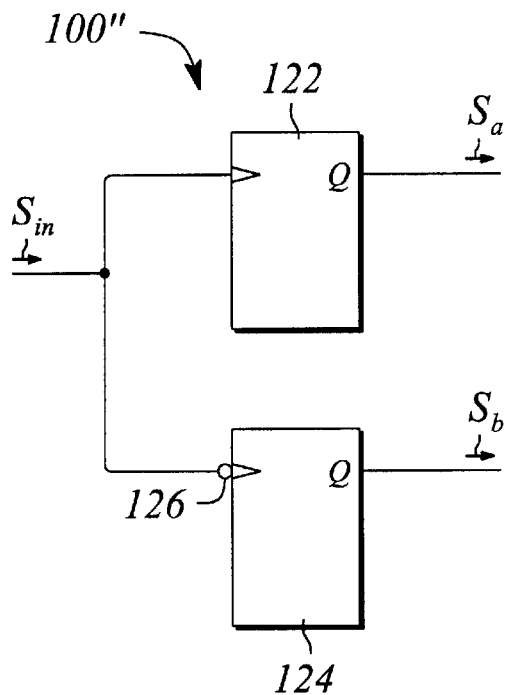
FIG. 5 illustrates still another embodiment of a transition splitter apparatus of the present invention employing type T flip-flops.

Yet another embodiment of the transition splitter 100" of the present invention is illustrated in FIG. 5. The splitter comprises a first toggle or T flip-flop 122, a second T flip-flop 124, and an inverter 126. Each of the T flip-flops 122, 124 has a clock input depicted as a triangle and an output Q. The output state of a T flip-flop changes to a complimentary state each time the flip-flop is clocked (i.e. logic '0' to logic '1' or logic '1' to logic '0'). The input signal $S_{in}$ is applied to the clock input of the first T flip-flop 122 and to an input of the inverter 126. An output of the inverter is connected to the clock input of the second T flip-flop 124. The output Q of the first T flip-flop produces the signal $S_a$ while the output Q of the second T flip-flop 124 produces the signal $S_b$. The transition splitter 100" is equivalent to, but more general than, the transition splitter 100', since the connection configuration of each of the two D flip-flops 112, 114 in the transition splitter 100' is one way known in the art of implementing a T flip-flop.

Assuming, as before, that the input signal $S_{in}$ and the output signals $S_a$ and $S_b$ start at a low state '0', a first transition from the logic '0' to a logic '1' in the signal $S_{in}$ clocks the first T flip-flop 122. When clocked, the first T flip-flop 122 changes its output state from the logic '0' to the logic '1', thus introducing a transition in the signal $S_a$. At a second transition in the signal $S_{in}$ (from the logic '1' to a logic '0'), the second T flip-flop 124 is clocked. When clocked, the second T flip-flop 124 changes its output state from the logic '0'-to-a logic '1', thus introducing a transition in the signal $S_b$. At the next logic '0'-to-logic '1' transition, the first T flip-flop 122 is clocked and toggles its output state, while at the next logic '1'-to-logic '0' transition, the second T flip-flop 124 is clocked and toggles its output state.

Figure 6:
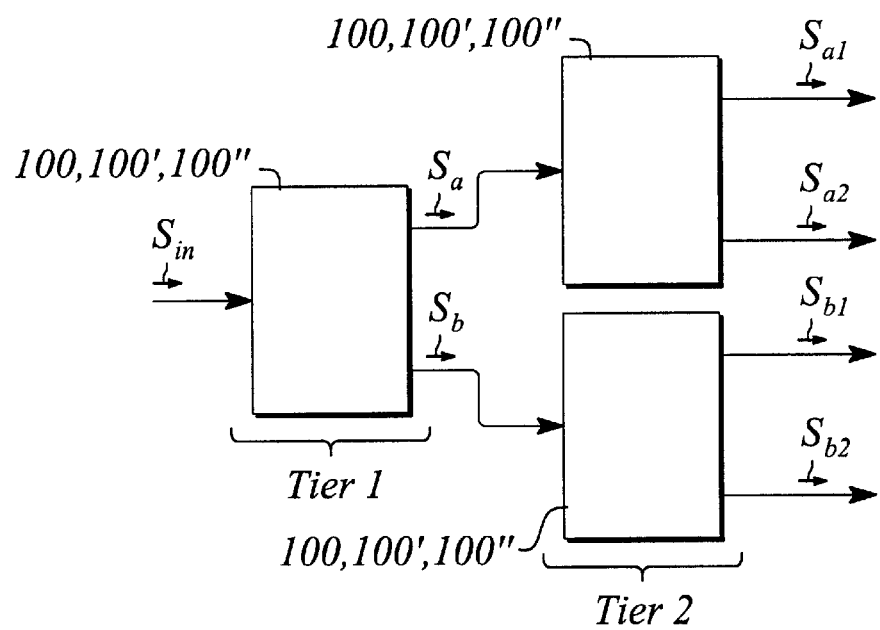
FIG. 6 illustrates a block diagram of a two-tier cascade of three transition splitter apparatuses of the present invention.

Advantageously, the transition splitter apparatus 100, 100', 100" of the present invention can be cascaded to increase the amount of transition rate reduction that is realized. A single transition splitter apparatus 100, 100', 100" reduces the maximum transition rate by a factor of two. Adding a second tier of transition splitters apparatuses 100, 100', 100", following a first transition splitter apparatus 100, 100', 100" produces output signals that have maximum transition rates that are reduced by a factor of 4 compared to the input signal $S_{in}$ transition rate. In general the transition rate reduction factor that can be achieved by cascading tiers of transition splitter apparatuses 100, 100', 100" is equal to $2^M$ where M is the number of tiers. FIG. 6 illustrates a cascade of three transition splitter apparatuses 100, 100', 100" in M=two tiers. The output signals $S_a$ and $S_b$ from Tier 1, each having one half of the transition rate of the input signal $S_{in}$ become the input signals to the Tier 2 apparatuses 100, 100', 100". The output signals $S_{a1}$, $S_{a2}$, $S_{b1}$ and $S_{b2}$ from Tier 2 each have one fourth of the transition rate of the input signal $S_{in}$, in accordance with this embodiment of the cascaded apparatuses of the present invention.

Figure 7:
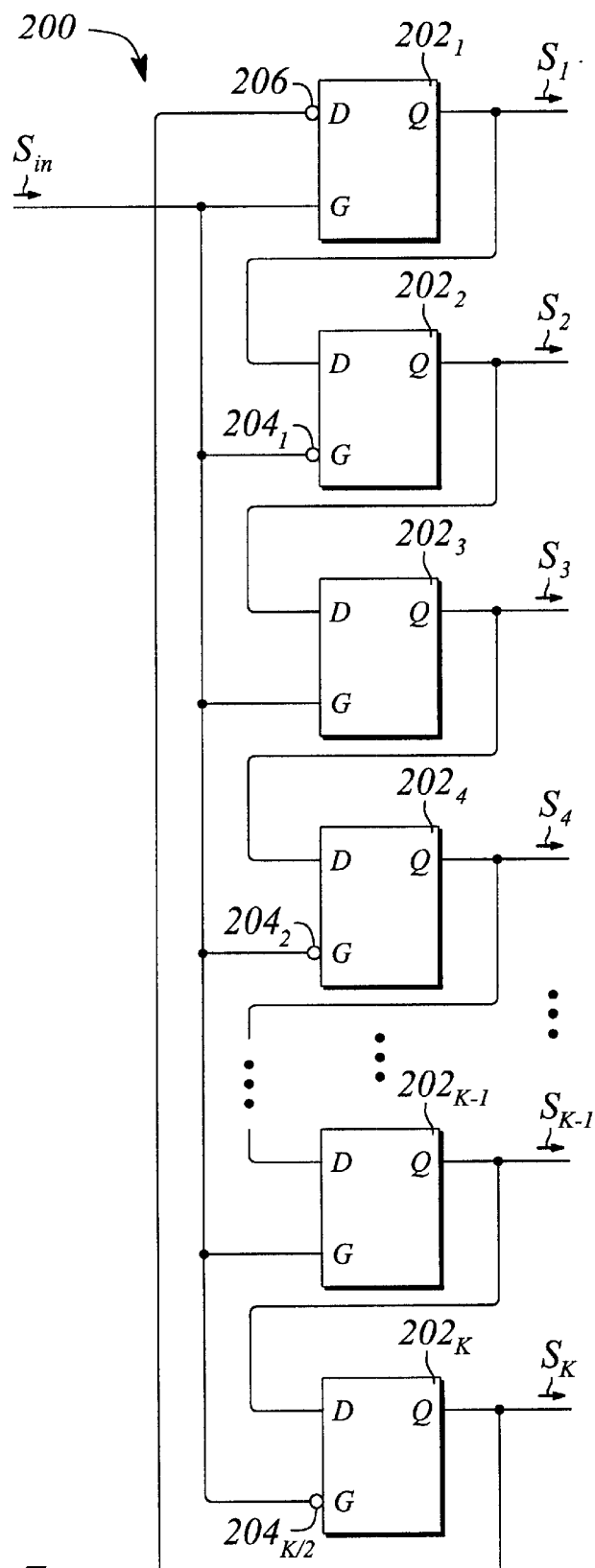
FIG. 7 illustrates a block diagram of a transition splitter of the present invention having K outputs where K is an even number.

In yet another aspect of the present invention, a transition splitter apparatus 200 having K outputs, where K is an even number greater than or equal to two, is provided. FIG. 7 illustrates a block diagram of the transition splitter apparatus 200. The transition splitter apparatus 200 comprises K transparent latches $202_1$, $202_2$, $202_3$, ... $202_K$. Each of the transparent latches 202 has a data input D, an enable input G, and an output Q. An input port of the transition splitter 200 is connected to the enable input G of all odd numbered transparent latches $202_1$, $202_3$, ... $202_{K-1}$. The input port of the transition splitter 200 is further invertedly connected to the enable input G of all even numbered transparent latches $202_2$, $202_4$, ... $202_K$. The output Q of the first transparent latch $202_1$ is connected to the data input D of the second transparent latch $202_2$. The output Q of the second latch $202_2$ is connected to the data input D of the third latch $202_3$. Similarly, the output Q of the third transparent latch $202_3$ is connected to the data input D of the fourth latch $202_4$, and so on, until the K-th latch $202_K$ is reached. The output Q of the K-th transparent latch $202_K$ is either invertedly connected to the data input D of the first transparent latch $202_1$ using an inverter 206 or the K-th latch $202_K$ may comprise two outputs Q and Q', where the output Q' is an inverted output that is connected to the data input D of the first transparent latch $202_1$.

In the preferred embodiment, the input port is invertedly connected to all even numbered latches $202_2$, $202_4$, ... $202_K$ using a plurality of inverters 204 between the input port and the enable inputs G of the latches 202. A first inverter $204_1$ of the plurality is connected between the input port and the enable input G of the second latch $202_2$, a second inverter $204_2$ of the plurality is connected between the input port and the enable input G of the fourth latch $202_4$, and so on, including an inverter $204_{K/2}$ on the enable input of the K-th latch $202_K$. Alternatively, even number latches $202_2$, $202_4$, ... $202_K$ may have an inverted enable input G' and the plurality of inverters 204 may be omitted. Likewise, as mentioned above, an inverter 206 can be used to invertedly connect the K-th output Q to the data input D of the first latch $202_1$. Alternatively, a K-th transparent latch $202_K$, having an inverted output Q', can be used and the inverter 206 can be omitted.

To understand the operation of the transition splitter apparatus 200, assume that an input signal $S_{in}$ is applied to the input port of the transition splitter 200 and K output signals $S_1$, $S_2$, ... $S_K$ are produced at the outputs Q of each of the latches 202. Also assume that the input signal $S_{in}$ and the output signals $S_1$, $S_2$, ... $S_K$ all start out having logic state of '0'. A first transition in the input signal $S_{in}$ from '0' to '1' enables the odd numbered latches $202_1$, $202_3$, ... $202_{K-1}$. A logic '1' present at the data input D of the first latch $202_1$ is transferred to the output Q of the first latch $202_1$, to produce a transition in the output signal $S_1$. The transition produced by the first latch $202_1$ is due to the inverted output signal $S_K$ from the K-th latch $202_K$ being connected to the data input D of the first latch $202_1$. All other output signals $S_2$, $S_3$, ... $S_K$ remain unchanged by the first transition. A second transition in the input signal $S_{in}$ disables the odd numbered latches $202_1$, $202_3$, ... $202_{K-1}$ and enables the even numbered latches $202_2$, $202_4$, ... $202_K$. A logic '1' present at the data input D of the second latch $202_2$ is transferred to the output Q of the second latch $202_2$, thereby inducing a transition in the output signal $S_2$. A third transition again enables the odd numbered latches $202_1$, $202_3$, ... $202_{K-1}$ and disables the even numbered latches $202_2$, $202_4$, ... $202_K$. A logic '1' present at the data input D of the third latch $202_3$ is transferred to the output Q of the third latch $202_3$, thereby producing a transition in the output signal $S_3$. This progression of transitions in output signals S continues until a transition is produced in the K-th signal $S_K$ at which time a logic '0' is present at the data input D of the first latch $202_1$. At the next transition in the input signal $S_{in}$, a logic '0' is transferred to the output Q of the first latch $202_1$ and the output signal $S_1$ transitions from '1' to '0'. Each of the output signals $S_1$ ... $S_K$ similarly transitions from '1' back to '0' on further successive transitions of the input signal $S_1$. The production of transitions in the output signals S from '0' to '1' and back to '0' described hereinabove repeats after every 2K transitions in the input signal $S_{in}$.

Figure 8:
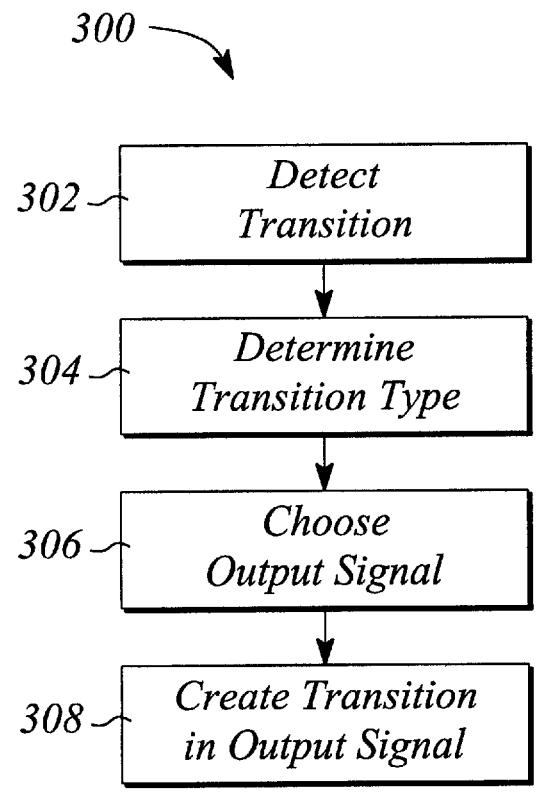
FIG. 8 illustrates a flow chart of a method of transition splitting of the present invention.

In another aspect of the present invention, a first method 300 and a second method 400 of transition splitting to reduce the maximum transition rate of a digital input signal are provided. FIG. 8 illustrates a flow chart of the method 300 of transition splitting. The method 300 comprises the step of detecting a transition 302 in an input signal. The method 300 further comprises the step of determining 304 a transition type. The number of transition types is equal to or less than the number of output signals available. The method 300 further comprises the step of choosing 306 one of a plurality of output signals and the step of creating 308 a transition in the chosen one of the plurality of output signals., The steps of detecting 302, determining 304, choosing 306 and creating 308 are repeated for each transition in the input signal.

Consider an example of the method 300 of transition splitting in which the plurality of output signals comprises two output signals $S_a$ and $S_b$. The transitions in an input signal $S_{in}$ can be divided into two types, for example odd numbered transitions and even numbered transitions. When a transition is detected 302, the type is determined 304 to be either odd or even. If it is determined 304 that the detected 302 transition is an odd numbered transition, signal $S_a$ is chosen 306 and a transition is created 308 in the signal $S_a$. On the other hand, if it is determined 304 that the detected 302 transition is an even numbered transition, signal $S_b$ is chosen 306 and a transition is created 308 in the signal $S_b$.

In another example of method 300, there may be two signals in the plurality of output signals and the transition types may be differentiated by whether they represent low-to-high ('0' to '1') or high-to-low ('1' to '0') transitions. In yet another example of method 300, the plurality of output signals includes more than two output signals, for example five output signals. In this example, five types of transitions (e.g., 1–5) are available to use in the five separate output signals 1–5, respectively. Using this example of 5 output signals, according to the method 300, a transition in the input signal is detected 202. The sequential number of the transition is determined 304. One of the five output signals is chosen 306 in which to create 308 the determined transition in the output signal for the given detected transition in the input signal. One way of assigning transition types is to define a transition type 1 as corresponding to detected transitions in the input signal numbered 1, 6, 11, 16, . . . A transition type 2 can be defined as corresponding to detected transitions in the input signal numbered 2, 7, 12, 17, . . . Transition types 3, 4, and 5 can be assigned in a similar manner. Conveniently, the transition type 1 then can be correlated to the first output signal of the plurality of five output signals, the transition type 2 correlated to the second output signal of the plurality and so on. However, how the determined transitions are correlated with respective output signals is not limited to that described above, as long as the respective determined transitions are repeatedly and consistently applied to the same output signals.

Figure 9:
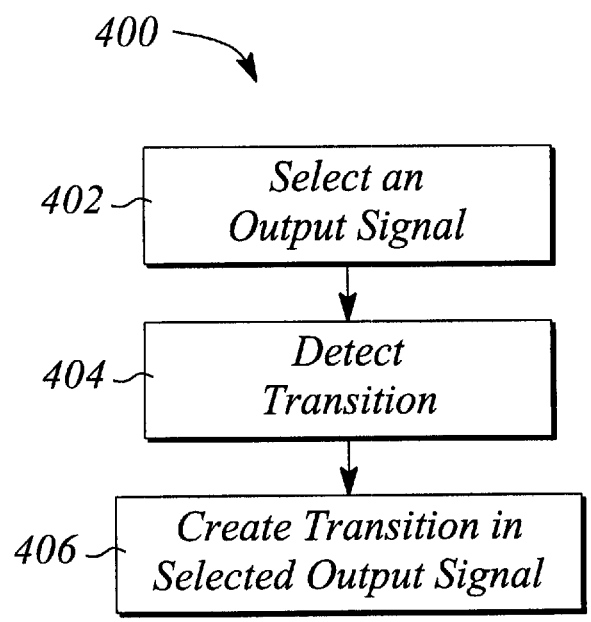
FIG. 9 illustrates a flow chart of another method of transition splitting of the present invention.

FIG. 9 illustrates a flow chart of the method 400 of transition splitting a digital input signal into a plurality of output signals each having a fraction of the transitions per unit time of the digital input signal. The method 400 comprises the step of selecting 402 an output signal from the plurality of output signals available. Normally the selected output signal is one of P output signals available to the method, where the number P can be any integer. The method 400 further comprises the step of detecting 404 a transition in the digital input signal followed by the step of creating 406 a transition in the selected output signal. The steps of selecting 402, detecting 404 and creating 406 are repeated for each transition in the input signal $S_{in}$.

In the preferred embodiment, the P output signals are selected sequentially, starting with a first signal $S_1$ and proceeding until the P-th signal $S_p$ is selected. Once the P-th signal $S_p$ is selected, the selection process repeats starting again with the first signal $S_1$. Therefore, detection of a first transition in the input signal $S_{in}$ results in the creation of a transition in the first signal $S_1$, detection of a second transition in the input signal $S_{in}$ results in the creation of a transition in the first signal $S_2$, and so on until the detection of the P-th transition that results in the creation of a transition in the P-th signal $S_p$. The detection of the next transition in the input signal results in the creation of a transition in the first signal $S_1$ again and the process described above repeats. Thus, a transition is created in a given signal S every P transitions of the input signal $S_{in}$.

The first method 300 or the second method 400 can be used in a manner in which some transitions in the input signal are skipped and/or omitted. For example, instead of creating 308, 406 a transition in a selected output signal for every transition or transition type in an input signal $S_{in}$ a transition may be created for every other transition in the input signal $S_{in}$. In some cases it may be sufficient to process only every other transition. On the other hand, if it is important for a given situation that all transitions be accounted for as a transition in at least one of the output signals, the input signal $S_{in}$ can be processed twice for this example. In a first application of the method 300 or 400, all odd numbered transitions in the input signal $S_{in}$ can be accounted for. In a second application of the method 300 or 400, all even numbered transitions can be processed. One skilled in the art can readily determine other permutation in which the methods 300, 400 can be used in situations that skip some transitions in the input signal $S_{in}$. All such permutations are within the scope of the present invention.

Thus, there has been described a novel transition splitter apparatus 100, 100', 100", 200, a cascade of apparatuses, and transition splitting methods 300, 400 for reducing the maximum transition rate of a digital signal while preserving the transition timing information of the digital signal. It should be understood that the above-described embodiments are merely illustrative of the some of the many specific embodiments that represent the principles of the present invention. Clearly, those skilled in the art can readily devise numerous other arrangements without departing from the scope of the present invention.

What is claimed is:

1. A system that reduces a transition rate of an input signal from devices under test in automatic testing comprising:
    a transition splitter apparatus that splits an input signal from the device under test into a plurality of output signals, each output signal having a fraction of the transition rate of the input signal while preserving relative timing of transitions in the input signal, the fraction being proportional to a number of output signals in the plurality; and
    automatic test equipment comprising:
        parallel processing channels, one channel for each output signal from the splitter apparatus, each channel having the capacity to process the fractional transition rate of the output signal in parallel; and
        means for re-integrating timing data generated by the parallel channels, such that timing data associated with the transition rate of the input signal is extractable.

2. A system for processing a digital signal with a high-speed transition rate comprising:
    a transition splitter apparatus that splits the high-speed digital signal into a plurality of digital output signals, each output signal having a relatively lower-speed transition rate, each low-speed transition rate being a fraction of the high-speed transition rate of the digital signal while preserving relative timing of transitions in the high-speed digital signal, the fraction being proportional to a number of output signals in the plurality; and
    means for processing the output signals from the transition splitter apparatus in parallel, the means for processing comprising a plurality of channels, each output signal being processed by a different channel, each channel being capable of processing the low-speed transition rate of a respective output signal while being unable to process the high-speed transition rate of the digital signal, the plurality of channels producing respective transition timing data that is further processed, the timing data comprising the preserved transition timing of the digital signal.

3. The system for processing of claim 2, wherein the means for processing further comprises means for re-integrating the timing data from the respective channels to facilitate extraction of information associated with the preserved transition timing in the digital signal.

4. The system for processing of claim 3, wherein the means for processing is automatic test equipment, the extracted information being whether a portion of the preserved transition timing from the re-integrated data meets a timing specification for the digital signal.

5. The system for processing of claim 2, wherein the means for processing is automatic test equipment that compares the timing data from the respective channels to a timing specification for the digital signal to determine whether the digital signal meets the specification.

6. The system for processing of claim 2, wherein the digital signal is from a device under test, the means for processing being automatic test equipment, the automatic test equipment testing the device, the automatic test equipment determining whether the device meets a device specification using the timing data from the respective channels.

7. The system for processing of claim 2, wherein the means for processing is a communications signal processor.

8. A method of processing a digital signal with a high-speed transition rate comprising:
    splitting the digital signal into a plurality of digital output signals, each output signal having a relatively lower-speed transition rate, each low-speed transition rate being a fraction of the high-speed transition rate of the digital signal while preserving relative timing of transitions in the high-speed digital signal, the fraction being proportional to a number of output signals in the plurality, the low-speed transition rates being readily processable while the high-speed transition rate being relatively nonprocessable; and
    processing the output signals in parallel to produce transition timing data, the timing data comprising the preserved transition timing of the digital signal.

9. The method of claim 8, wherein processing the output signals in parallel comprises re-integrating the timing data for each output signal; and extracting information associated with the preserved transition timing of the digital signal.

10. The method of claim 9, wherein extracting information comprises comparing a portion of the preserved transition timing from the re-integrated data to a timing specification for the digital signal.

11. The method of claim 10, wherein extracting information further comprises determining whether the portion meets the timing specification.

12. The method of claim 8, wherein processing the output signals in parallel comprises comparing the timing data to a timing specification for the digital signal to determine whether the digital signal meets the specification.

13. The method of claim 8, wherein the digital signal is from a device under test, and wherein splitting the digital signal and processing the output signals in parallel determine whether the device meets a device specification using the timing data.

14. The method of claim 8, wherein processing the output signals in parallel comprises digital signal processing the plurality of output signals for communications applications.

15. A method of testing a device under test comprising:

splitting a digital signal from the device under test into a plurality of digital output signals, the digital signal having a high-speed transition rate, each output signal having a relatively lower-speed transition rate, each low-speed transition rate being a fraction of the high-speed transition rate of the digital signal while preserving relative timing of transitions in the high-speed digital signal, the fraction being proportional to a number of output signals in the plurality, the low-speed transition rates being readily processable while the high-speed transition rate is not; and processing the output signals in parallel to produce transition timing data, the timing data comprising the preserved transition timing of the digital signal, the timing data being used to test the device.

16. The method of testing of claim 15, wherein processing the output signals in parallel comprises re-integrating the timing data of each output signal; and extracting information associated with the preserved transition timing of the digital signal from the re-integrated timing data.

17. The method of testing of claim 16, wherein extracting information comprises comparing a portion of the preserved transition timing from the re-integrated data to a device specification for the device to determine whether the portion meets the specification.

18. The method of testing of claim 15, wherein processing the output signals in parallel comprises comparing the timing data to a specification for the device to determine whether the device meets the specification.

\* \* \* \* \*